(12) United States Patent
Riviere-Cazaux

(10) Patent No.: US 7,982,247 B2
(45) Date of Patent: Jul. 19, 2011

(54) TRANSISTOR WITH GAIN VARIATION COMPENSATION

(75) Inventor: Lionel J. Riviere-Cazaux, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 407 days.

(21) Appl. No.: 12/194,131

(22) Filed: Aug. 19, 2008

(65) Prior Publication Data

US 2010/0044780 A1 Feb. 25, 2010

(51) Int. Cl.
*H01L 27/148* (2006.01)
(52) U.S. Cl. . 257/240; 257/286; 257/401; 257/E27.131; 257/E29.2
(58) Field of Classification Search .......... 257/240, 257/241, 286, 309, 401, E27.131, E27.152, 257/E29.2, 29.052, E21.633
See application file for complete search history.

(56) References Cited

U.S. PATENT DOCUMENTS

| 6,750,518 | B2 | 6/2004 | Nishibe et al. | |
|---|---|---|---|---|
| 7,348,244 | B2 | 3/2008 | Aoki et al. | |
| 7,402,844 | B2 | 7/2008 | Sriram | |
| 2002/0113277 | A1* | 8/2002 | Mehrotra et al. | 257/401 |

FOREIGN PATENT DOCUMENTS

| JP | 11-017167 A | 1/1999 |
|---|---|---|
| JP | 2000049240 A | 2/2000 |
| JP | 2003060197 A | 2/2003 |

OTHER PUBLICATIONS

PCT Application PCT/US2009/048648 Search Report and Written Opinion, mailed Jan. 28, 2010.

* cited by examiner

*Primary Examiner* — Evan Pert
*Assistant Examiner* — Scott Wilson
(74) *Attorney, Agent, or Firm* — James L. Clingan, Jr.

(57) ABSTRACT

A semiconductor device and method of making comprises providing an active device region and an isolation region, the isolation region forming a boundary with the active device region. A patterned gate material overlies the active device region between first and second portions of the boundary. The patterned gate material defines a channel within the active device region, the gate material having a gate length dimension perpendicular to a centerline along a principal dimension of the gate material which is larger proximate the first and second portions of the boundary than in-between the first and second portions of the boundary. The channel includes a first end proximate the first portion of the boundary and a second end proximate the second portion of the boundary, further being characterized by gate length dimension tapering on both ends of the channel.

20 Claims, 3 Drawing Sheets

US 7,982,247 B2

TRANSISTOR WITH GAIN VARIATION COMPENSATION

BACKGROUND

1. Field

This disclosure relates generally to integrated circuits, and more specifically, to integrated circuits with MOSFET transistors in which the gates are shaped.

2. Related Art

Circuit designs are based on the electrical characteristics of the elements being used in the particular circuit design. In the case of transistors, one of the important characteristics is the amount of current flowing for a given condition. This can be considered the effective width to length ratio of the gate. Due to process and lithography variables, the amount of current, or effective width to length ratio, varies from one transistor to another especially from wafer to wafer but can also be true on the same wafer or even the same integrated circuit. Such variation in effective width to length ratio makes circuit design more difficult. Reduction in such effective width to length ratio variation can result in the design of a circuit that has improved performance such as increased speed of operation, increased reliability of operation, and reduced power consumption. Of course there is continuing efforts to improve the manufacturing processes including lithography, but with improvements in these come reductions in transistor size which in turn has the effect of retaining the effective width to length variations.

Thus there is a continuing need for improvements in controlling the effective width to length ratio variation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device has a gate which crosses two boundaries between an active region and an isolation region. There is a corresponding channel under the gate. The gate length is longer at each of the two boundaries where the gate crosses between the active region and the isolation region than in a middle region between the two locations. The result is a reduced variation in effective width to length ratio of the gate.

The semiconductor substrate described herein can be any semiconductor material or combinations of materials, such as gallium arsenide, silicon germanium, silicon-on-insulator (SOI), silicon, monocrystalline silicon, the like, and combinations of the above in which at least a top portion is of semiconductor material and may be considered a semiconductor layer.

Figure 1:
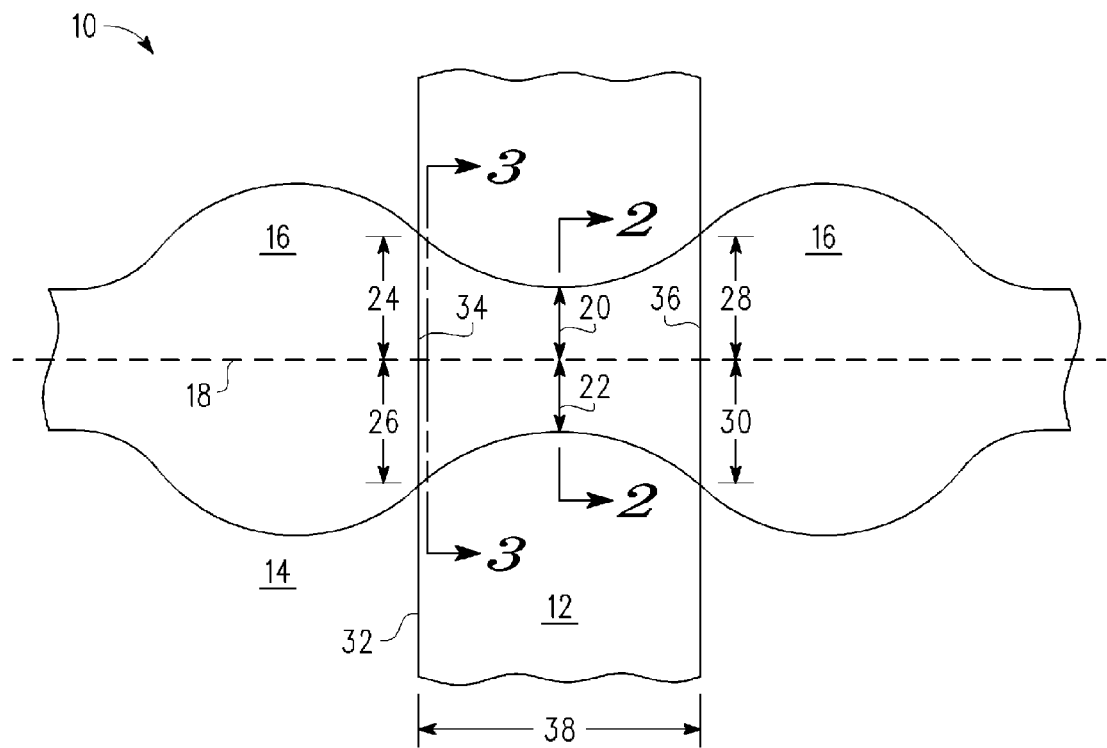
FIG. 1 is a top view of semiconductor device according to an embodiment.

Shown in FIG. 1 is a semiconductor device 10 having an active region 12 formed in a semiconductor substrate, an isolation region 14 surrounding active region 12, and gate conductor 16 crossing over active region 12. Also shown in FIG. 1 is centerline 18 passing in the middle of gate 16. Centerline 16 may also be considered a plane passing vertically down into semiconductor 10. There is a boundary 32 between active region 12 and isolation region 14. Shown on a left side of FIG. 1 is a boundary portion 34 that is a first portion of boundary 32 that is a region where gate conductor 16 crosses between active region 12 and isolation region 14. Shown on a right side of FIG. 1 is a boundary portion 36 that is a second portion of boundary 32 that is a region where gate conductor 16 crosses between active region 12 and isolation region 14. Midway between boundary portion 34 and boundary portion 36 along centerline 18 is a minimum gate length comprised of dimension 20 from centerline 18 to a first edge, which is shown in FIG. 1 as the upper side, of gate conductor 16 and dimension 22 from centerline to a second edge, which is shown in FIG. 1 as the lower side, of gate conductor 16. Dimensions 20 and 22 are equal. Centerline 18 is defined as being in the direction of the gate width and passing through the midpoint between boundary portions 34 and 36 such that dimensions 20 and 22 are equal. From centerline 18 to the upper side of gate conductor 16 along boundary portion 34 is a dimension 24. From centerline 18 to the lower side of gate conductor 16 along boundary portion 34 is a dimension 26. From centerline 18 to the upper side of gate conductor 16 along boundary portion 36 is a dimension 28. From centerline 18 to the lower side of gate conductor 16 along boundary portion 36 is a dimension 30.

In this example, dimensions 24 and 28 are each greater than dimension 20, and dimensions 26 and 30 are each greater than dimension 22. Also in this example, which is symmetric, dimension 24 is equal to dimension 28, and dimension 26 is equal to dimension 30. Symmetry of gate conductor 16 relative to boundary portions 34 and 36, however, is not required. Thus, dimension 24 need not equal dimension 28, dimension 26 need not equal dimension 30. In general centerline 18 would be expected to be located so that dimensions 24 and 26 are equal and dimensions 28 and 30 are equal but this is not necessarily the case. For example, dimensions 22, 26, and 30 could be equal and dimensions 24 and 28 would each exceed dimension 20. The requirement is that the sums of dimensions 24 and 26 and dimensions 28 and 30 must each exceed the sum of dimensions 20 and 22. The result is that the channel length at each boundary between the active region and the isolation region is greater than the channel length in the middle portion of the channel between the boundaries. Thus, symmetry may be preferred, asymmetry may be employed. Also the symmetry can be by side such as right symmetry and left symmetry but the right and left not being symmetric to each other.

As gate dimensions continue to shrink, the short channel effects along the boundary between the active region and the isolation region become more significant relative to the whole width of the channel. With short channel effects, the variation in effective gate width to gate length ratio for a given physical change in gate length is more exponential-like along the boundary between the active region and the isolation region than effective gate width to gate length ratio in the middle of the channel. By increasing the length of the gate along the active/isolation boundaries, the impact of the short channel effects is greatly reduced. The result is that changes in gate length cause less change in the overall effective gate width to gate length ratio.

Accidental and unwanted increases in gate length on one side of the channel have occurred when a contact has come too close to the gate. The widening of the gate conductor outside the active area has caused an increase in the gate length at the active/isolation boundary on one side only of the gate. This has been considered undesirable and to be avoided. There are design rules requiring the gate contact to be far enough away from the active region to ensure that this gate widening at the active/isolation boundary does not occur.

Figure 2:
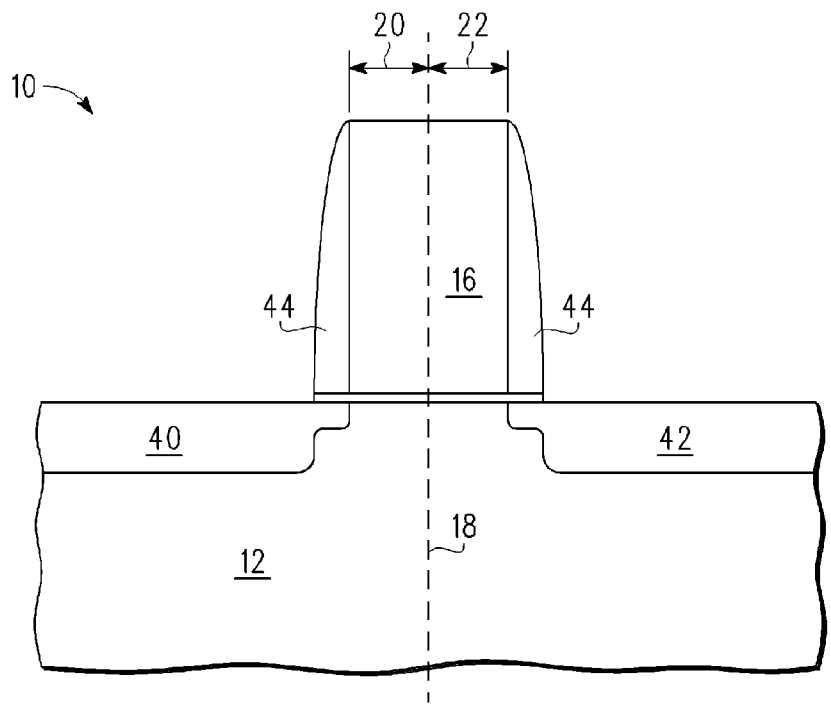
FIG. 2 is a first cross section of the semiconductor device of FIG. 1.

Shown in FIG. 2 is semiconductor device 10 in a cross section taken along 2-2 shown in FIG. 1. Shown in FIG. 2 is centerline 18 midway through gate conductor 16. Also shown are dimensions 20 and 22 extending laterally from centerline 18 to the sides of gate conductor 16 and as the gate length over a portion of active region 12 that is between a source/drain region 40 and a source/drain region 42. A sidewall spacer 44 is shown around gate conductor 16. Semiconductor device 10 as shown in FIG. 2 is a functional transistor with a channel region between source/drain regions 40 and 42. As shown, source/drains 40 and 42 are aligned to sides of gate conductor 16, but source/drain regions 40 and 42 would likely extend slightly under gate conductor 16 with required heating steps subsequent to steps of implanting using gate conductor 16 as a mask. Sidewall spacer 44 may be multiple layers of sidewall spacers as well as one or more liners.

Figure 3:
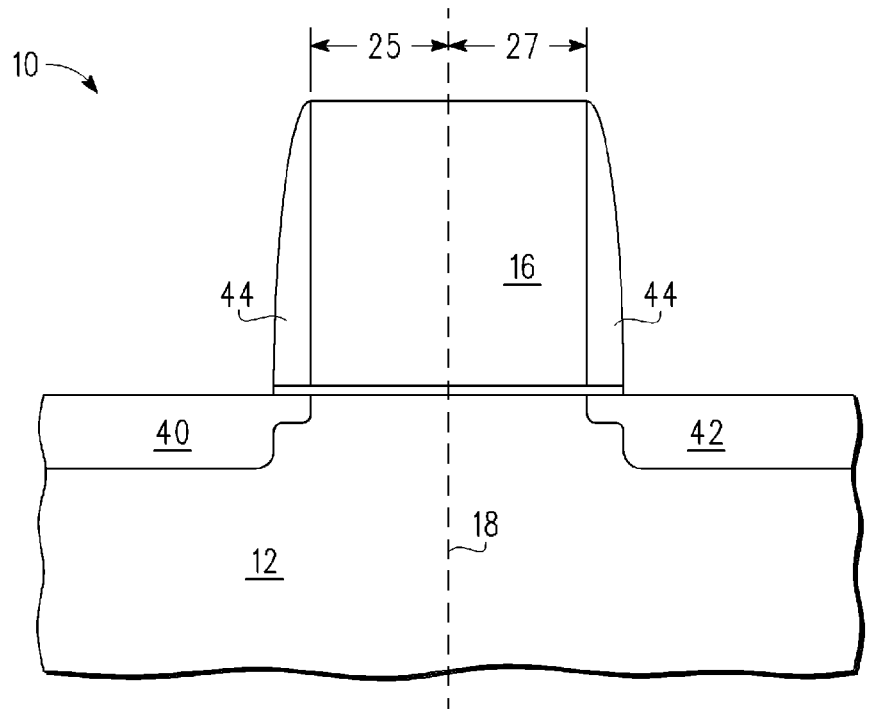
FIG. 3 is a second cross section of the semiconductor device of FIG. 2.

Shown in FIG. 3 is semiconductor device 10 in a cross section taken along 3-3 shown in FIG. 1 which is very near boundary portion 34 where gate conductor has the gate length of dimension 24 and 26. Shown in FIG. 3 is centerline 18 midway through gate conductor 16. Also shown are dimensions 25 and 27 extending laterally from centerline 18 to the sides of gate conductor 16 and as the gate length over a portion of active region 12 that is between a source/drain region 40 and a source/drain region 42. Dimension 25 is very near to be the same as dimension 24, and dimension 27 is very near the same as dimension 26. Sidewall spacer 44 is shown around gate conductor 16. As shown, source/drains 40 and 42 are aligned to sides of gate conductor 16 to show that the channel length at cross section 3-3 near boundary portion 34 corresponds to the gate length at this location which is dimension 25 plus dimension 27.

Figure 4:
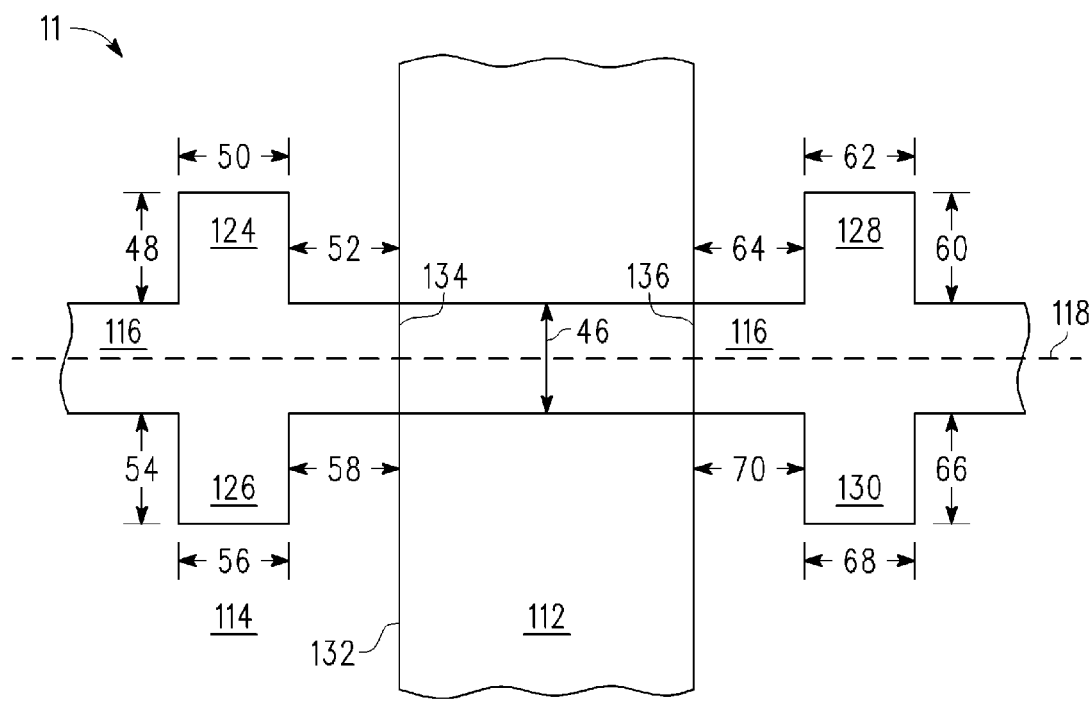
FIG. 4 is a layout at a physical design or mask generation stage useful in obtaining the semiconductor device of FIG. 1.

Shown in FIG. 4 is a layout 11 which may be used in forming semiconductor device 10. Layout 11 may also be viewed as several masks overlaid to depict what is lithographically applied to photoresist in processing used to obtain semiconductor device 10 of FIG. 1 In this case there is a gate feature 116 which corresponds to gate conductor 16. Gate feature 116 includes a jog 124 in the upper left, a jog 126 in the lower left, a jog 128 in the upper right, and a jog 130 in the lower right. Jogs 124, 126, 128, and 130 are added to gate feature 116 to cause the shape of gate 16 shown in FIG. 1. As shown jogs 124, 126, 128, and 130 are the same shape and distance from active feature 112, which is representative of active region 12, to create the shape, which is symmetric, of gate conductor 16 shown in FIG. 1. This symmetry is preferable, but one of jogs 124 and 126 and/or one of jogs 128 and 130 may be deleted and still obtain a reduction in effective gate width to gate length variation. Jog 124 is shown as a dimension 52 from a left side of active region 112 which is representative of active region 12. Jog 124 has a width of dimension 50 and length of dimension 48. Jog 126 has a length of dimension 54, a width of dimension 56, and a distance of dimension 58 from active region 112. Jog 128 has a length of dimension 60, a width of dimension 62, and a distance of dimension 64 from active region 112. Jog 130 has a length of dimension 66, a width of dimension 68, and a distance of dimension 70 from active region 112.

With processing, jogs 124, 126, 128, and 124 have the effect of increasing the gate length of gate conductor 16 over active region 12. The various dimensions shown in FIG. 4 can best be derived experimentally for the particular process and lithography that is to be implemented in order to achieve the best of the possible shapes for gate conductor 16. Also a parallel conductor feature on one or both sides of gate feature 116 with jogs aligned to those of gate feature 116 may also be used to shape gate conductor 16. The added parallel conductor features with aligned jogs will tend to increase the amount of added gate length at the active/isolation boundary as well as move the gate length increase closer to the center area between the active/isolation boundaries. Reducing dimensions 52, 58, 64, and 66 also moves the gate length increase closer to the center area between the active/isolation boundaries. Increasing dimensions 50, 56, 62, and 68 increases the breath and magnitude of the gate length increase. Increasing dimensions 48, 54, 64, and 70 generally increases the magnitude of the gate length increase but is limited without a corresponding increase in dimensions 52, 58, 64, and 66. Representative dimensions for the general effect of beneficially using jogs for increasing the gate length at boundary portions for about the first 30 to 50 nanometers from boundary portions 34 and 36 inward toward the middle region of gate conductor 16 over active region 12. For P channel the first 30 nanometers are most important. For N channel the significance extends to about 50 nanometers. Less than these amounts may still be effective though.

A method is thus to form isolation region 12 around active region 12 following by forming a gate dielectric followed by depositing a layer of gate material such as polysilicon or a metal. A layer of photoresist is deposited and patterned according to gate feature 116 and possibly other parallel lines with jogs aligned or nearly aligned to the jogs of gate feature 116. The patterned photoresist is then used as a mask while the layer gate material is etched. The result of the photoresist patterning and the subsequent etching is a gate like gate conductor 16 in which the gate length is longer at the active/isolation interface than in the area between the active/isolation interfaces. The gate conductor is used as a mask while implanting source/drain regions is performed. Sidewall spacer is formed and also used as a mask during the implanting for forming source/drain regions.

Figure 5:
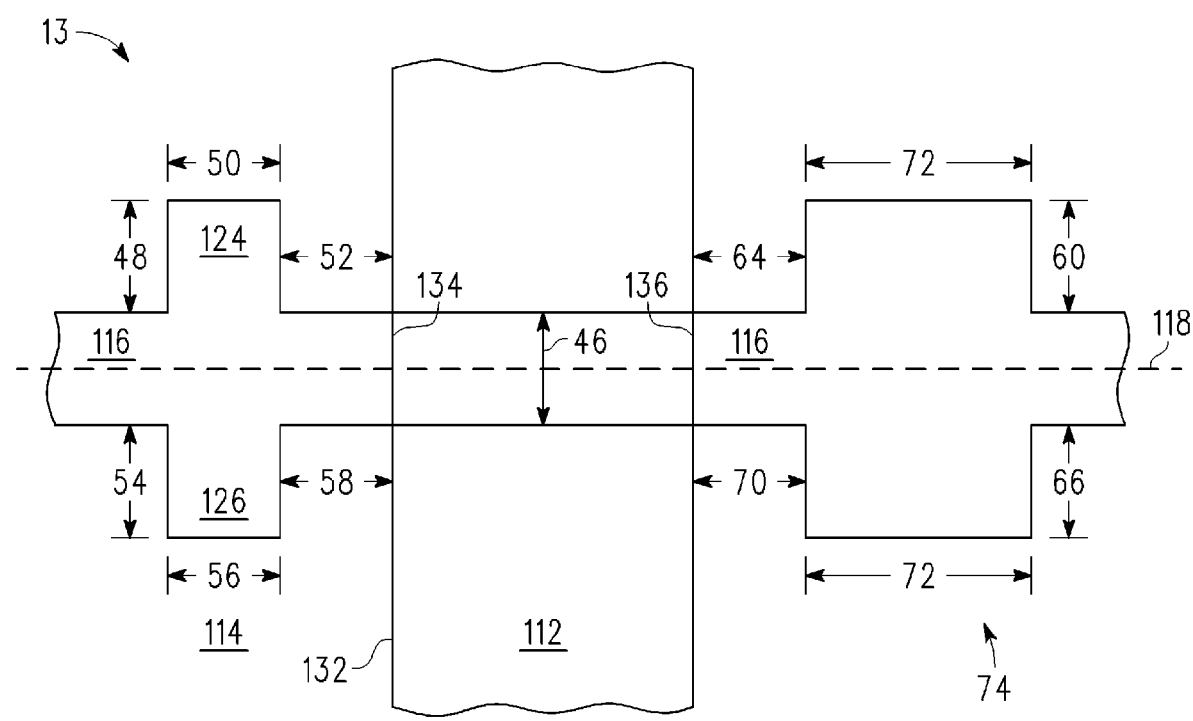
FIG. 5 is a variation on the layout of FIG. 4 useful in obtaining a variation on the semiconductor device of FIG. 1.

Shown in FIG. 5 is a layout 13, which may also be considered masks as described for FIG. 4, as a variation to layout 11 of FIG. 4. Jogs 124 and 126 have no purpose other than shaping gate conductor 16 but by increasing dimensions 62 and 68 jogs 128 and 130 of FIG. 4 may become a contact feature 74 for use in forming a contact region for making electrical contact to gate conductor 16. This may be an efficient way to achieve both the needed contact for a gate while also increasing the gate length at the active/isolation boundary. This is an example of the result having symmetry on the left and having symmetry on the right but the right and left would not be symmetric with each other. As for layout 11, the actual dimensions used will depend on the particular process and the lithography. The principle, however, is that the jogs on the gate feature, which may be used in combination with lines parallel to the gate feature having jogs aligned or nearly aligned to the jogs of the gate feature, may be used to shape the gate conductor so that on both boundary portions where the gate crosses between an active region and an isolation region the gate length is greater than it is in the middle region between those boundary portions.

By now it should be appreciated that there has been provided a semiconductor device having an active region, an isolation region, and a patterned gate material. The isolation region forms a boundary with the active device region. The patterned gate material overlies the active device region between first and second portions of the boundary and is for defining a channel within the active device region. The patterned gate material has a gate length dimension perpendicular to a centerline along a principal dimension of the patterned gate material which is larger proximate the first and second portions of the boundary than in-between the first and second portions of the boundary. The semiconductor device may be further characterized by the channel including a first end proximate the first portion of the boundary and a second end proximate the second portion of the boundary, the channel further being characterized by gate length dimension tapering on both ends of the channel. The semiconductor device may be further characterized by the gate length dimension perpendicular to the centerline proximate the first portion being symmetric about the centerline. The semiconductor device may be further characterized by the gate length dimension perpendicular to the centerline proximate the first portion being asymmetric about the centerline. The semiconductor device may be further characterized by the gate length dimension perpendicular to the centerline proximate the second portion being symmetric about the centerline. The semiconductor device may be further characterized by the gate length dimension perpendicular to the centerline proximate the second portion being asymmetric about the centerline. The semiconductor device may be further characterized by the gate length dimension perpendicular to the centerline (i) proximate the first portion being symmetric about the centerline and (ii) proximate the second portion being symmetric about the centerline. The semiconductor device may be further characterized by the gate length dimension perpendicular to the centerline (i) proximate the first portion being asymmetric about the centerline and (ii) proximate the second portion being asymmetric about the centerline. The semiconductor device may be further characterized by the isolation region comprising a shallow trench isolation region. The semiconductor device may be further characterized by the patterned gate material comprising one of a group consisting of polysilicon and metal. The semiconductor device may be further characterized by short channel effects proximate the first and second portions of the boundary being reduced in response to a larger gate length dimension at ends of the channel as compared to short channel effects in-between the first and second portions of the boundary. The semiconductor device may be further characterized by the channel including a channel width between the first and second portions of the boundary and wherein an undesirable current density magnitude effect extends from at least one end of the channel inwardly at a maximum distance on the order of between thirty to fifty percent (30-50%) of the channel width. The semiconductor device may be further characterized by the channel width being about 100 nm and the undesirable current density magnitude effect extending from at least one end of the channel inwardly between about 30 to 50 nm.

Also described is a semiconductor device having an active region, an isolation region, and a patterned gate material. The isolation region forms a boundary with the active device region. The patterned gate material overlies the active device region between first and second portions of the boundary for defining a channel within the active device region. The patterned gate material has a gate length dimension perpendicular to a centerline along a principal dimension of the gate material which is larger proximate the first and second portions of the boundary than in-between the first and second portions of the boundary. The channel includes a first end proximate the first portion of the boundary and a second end proximate the second portion of the boundary, the channel further being characterized by gate length dimension tapering on both ends of the channel. The gate length dimension perpendicular to the centerline proximate the first portion is one of symmetric and asymmetric about the centerline. The gate length dimension perpendicular to the centerline proximate the second portion is one of symmetric and asymmetric about the centerline.

Described also is a method of making a semiconductor device. The method includes forming an isolation region about an active device region. The method further includes patterning a gate material overlying the isolation and active device regions, wherein patterning includes patterning the gate material to result in a patterned gate material having a principal dimension overlying at least the active device region between first and second portions of a boundary that defines a channel within the active device region, the patterned gate material having a gate length dimension perpendicular to a centerline along the principal dimension of the patterned gate material which is larger proximate the first and second portions of the boundary than in-between the first and second portions of the boundary. The method may further characterized by the patterning the gate material further including providing a mask with gate shape tapering features configured to produce the gate length dimension along the principal dimension of the patterned gate material in response to lithographically processing the gate material overlying the active device region using the mask. The method may further characterized by the providing the mask with gate shape tapering features including providing gate taper modulation features within a device layout for the semiconductor device, prior to an optical proximity correction processing, and prior to mask fabrication. The method may further characterized by the channel including a first end proximate the first portion of the boundary and a second end proximate the second portion of the boundary, the channel further being characterized by gate length dimension tapering on both ends of the channel. The method may further characterized by the gate length dimension perpendicular to the centerline proximate the first portion being one of symmetric and asymmetric about the centerline, and wherein the gate length dimension perpendicular to the centerline proximate the second portion is one of symmetric and asymmetric about the centerline. The method may further characterized by the isolation region comprising a shallow trench isolation, and wherein the gate material comprises one of a group consisting of polysilicon and metal.

Although the invention has been described with respect to specific conductivity types or polarity of potentials, skilled artisans appreciated that conductivity types and polarities of potentials may be reversed.

Moreover, the terms "front," "back," "top," "bottom," "over," "under," "left," "right," "upper," "lower," and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the layout itself may not have the jogs and they could be added at the mask level. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A semiconductor device comprising:
an active device region (12);
an isolation region (14), wherein the isolation region forms a boundary (32) with the active device region; and
a patterned gate material (16) overlying the active device region between first and second portions of the boundary for defining a channel within the active device region, the patterned gate material having a gate length dimension perpendicular to a centerline along a principal dimension of the patterned gate material which is larger proximate the first and second portions of the boundary than in-between the first and second portions of the boundary.

2. The semiconductor device of claim 1, wherein the channel includes a first end proximate the first portion of the boundary and a second end proximate the second portion of the boundary, the channel further being characterized by gate length dimension tapering on both ends of the channel.

3. The semiconductor device of claim 1, wherein the gate length dimension perpendicular to the centerline proximate the first portion is symmetric about the centerline.

4. The semiconductor device of claim 1, wherein the gate length dimension perpendicular to the centerline proximate the first portion is asymmetric about the centerline.

5. The semiconductor device of claim 1, wherein the gate length dimension perpendicular to the centerline proximate the second portion is symmetric about the centerline.

6. The semiconductor device of claim 1, wherein the gate length dimension perpendicular to the centerline proximate the second portion is asymmetric about the centerline.

7. The semiconductor device of claim 1, wherein the gate length dimension perpendicular to the centerline (i) proximate the first portion is symmetric about the centerline and (ii) proximate the second portion is symmetric about the centerline.

8. The semiconductor device of claim 1, wherein the gate length dimension perpendicular to the centerline (i) proximate the first portion is asymmetric about the centerline and (ii) proximate the second portion is asymmetric about the centerline.

9. The semiconductor device of claim 1, wherein the isolation region comprises a shallow trench isolation region.

10. The semiconductor device of claim 1, wherein the patterned gate material comprises one of a group consisting of polysilicon and metal.

11. The semiconductor device of claim 1, wherein short channel effects proximate the first and second portions of the boundary are reduced in response to a larger gate length dimension at ends of the channel as compared to short channel effects in-between the first and second portions of the boundary.

12. The semiconductor device of claim 1, wherein the channel includes a channel width between the first and second portions of the boundary and wherein an undesirable current density magnitude effect extends from at least one end of the channel inwardly at a maximum distance on the order of between thirty to fifty percent (30-50%) of the channel width.

13. The semiconductor device of claim 12, further wherein the channel width is about 100 nm and the undesirable current density magnitude effect extends from at least one end of the channel inwardly between about 30 to 50 nm.

14. A semiconductor device comprising:
an active device region;
an isolation region, wherein the isolation region forms a boundary with the active device region; and
a patterned gate material overlying the active device region between first and second portions of the boundary for defining a channel within the active device region, the patterned gate material having a gate length dimension perpendicular to a centerline along a principal dimension of the gate material which is larger proximate the first and second portions of the boundary than in-between the first and second portions of the boundary,
wherein the channel includes a first end proximate the first portion of the boundary and a second end proximate the second portion of the boundary, the channel further being characterized by gate length dimension tapering on both ends of the channel,
wherein the gate length dimension perpendicular to the centerline proximate the first portion is one of symmetric and asymmetric about the centerline, and
wherein the gate length dimension perpendicular to the centerline proximate the second portion is one of symmetric and asymmetric about the centerline.

15. A method of making a semiconductor device comprising:
forming an isolation region about an active device region; and
patterning a gate material overlying the isolation and active device regions, wherein patterning includes patterning the gate material to result in a patterned gate material having a principal dimension overlying at least the active device region between first and second portions of a boundary that defines a channel within the active device region, the patterned gate material having a gate length dimension perpendicular to a centerline along the principal dimension of the patterned gate material which is larger proximate the first and second portions of the boundary than in-between the first and second portions of the boundary.

16. The method of claim 15, wherein patterning the gate material further includes providing a mask with gate shape tapering features configured to produce the gate length dimension along the principal dimension of the patterned gate material in response to lithographically processing the gate material overlying the active device region using the mask.

17. The method of claim 16, further wherein providing the mask with gate shape tapering features includes providing gate taper modulation features within a device layout for the semiconductor device, prior to an optical proximity correction processing, and prior to mask fabrication.

18. The method of claim 15, wherein the channel includes a first end proximate the first portion of the boundary and a second end proximate the second portion of the boundary, the channel further being characterized by gate length dimension tapering on both ends of the channel.

19. The method of claim 15, wherein the gate length dimension perpendicular to the centerline proximate the first portion is one of symmetric and asymmetric about the centerline, and wherein the gate length dimension perpendicular to the centerline proximate the second portion is one of symmetric and asymmetric about the centerline.

20. The method of claim 15, wherein the isolation region comprises a shallow trench isolation, and wherein the gate material comprises one of a group consisting of polysilicon and metal.

* * * * *